United States Patent
Qi et al.

(10) Patent No.: US 7,283,943 B1
(45) Date of Patent: Oct. 16, 2007

(54) METHOD OF MODELING CIRCUIT CELLS FOR POWERGRID ANALYSIS

(75) Inventors: Xiaoning Qi, Sunnyvale, CA (US); Anuj Trivedi, Sunnyvale, CA (US); Kenneth Y. Yan, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 445 days.

(21) Appl. No.: 10/876,218

(22) Filed: Jun. 24, 2004

(51) Int. Cl.
*G06F 17/50* (2006.01)
*G06F 7/60* (2006.01)
*G06F 9/45* (2006.01)
*H03K 19/00* (2006.01)

(52) U.S. Cl. .............. 703/14; 703/2; 716/1; 716/3; 716/7; 716/10; 716/17

(58) Field of Classification Search .............. 703/14, 703/2; 716/1, 3, 7, 10, 17
See application file for complete search history.

(56) References Cited

U.S. PATENT DOCUMENTS 5,878,053 A 3/1999 Koh et al.
2002/0170020 A1 11/2002 Darden et al.

OTHER PUBLICATIONS

Min Zhao, Rajendran V. Panda, Sachin S. Sapatnekar and David Blaauw, "Hierarchical Analysis of Power Distribution Networks", IEEE Transactions on Computer-Aided Design of Integrated Circuits and Systems, vol. 21, No. 2 Feb. 2002, pp. 159-168.*
Rajendran Panda, David Blaauw, Vladimir Zolotov, Brian Young and Ravi Ramaraju, "Model and Analysis for Combined Package and On-Chip Power Grid Simulation", ACM 1-58113-190-9/00/0007, 2000, pp. 179-184.*
US Appl. No. 10/876,217, filed Jun. 24, 2004 and naming as inventor(s) Kenneth Y. Yan, Anuj Trivedi and Xiaoning Qi.
Sheehan, Bernard N., "Ticer: Realizable Reduction of Extracted RC Circuits," iccad, p. 200, 1999 International Conference on Computer-Aided Design (ICCAD '99), IEEE Computer Society, Washington, D.C., 1999.
Qian et al., "Hierarchical Random-walk Algorithms for Power Grid Analysis", Proceedings of the ASP-DAC 2004, Design Automation Conference, Asia and South Pacific, pp. 499-504, Jan. 27-30, 2004.

* cited by examiner

Primary Examiner—Paul Rodriguez
Assistant Examiner—Dwin McTaggart Craig
(74) Attorney, Agent, or Firm—Dorsey & Whitney LLP

(57) ABSTRACT

Techniques for modeling a circuit cell of a microprocessor or other integrated circuit for hierarchical powergrid analysis are disclosed herein. Distribution coefficients, used to distribute node voltages and capacitances to respective parts of the cell, are determined for each internal node of the cell. Current distribution coefficients may also be determined for each resistor in the cell. Using the distribution coefficients, internal cell capacitances are modeled as port capacitors. Resistive elements are modeled as a resistor network having no internal nodes. Transistor elements are modeled as port current sources. Such a model permits back calculation of internal node voltages and currents.

44 Claims, 4 Drawing Sheets

METHOD OF MODELING CIRCUIT CELLS FOR POWERGRID ANALYSIS

CROSS-REFERENCE TO RELATED APPLICATION(S)

This application is related to application Ser. No. 10/876,217, entitled "N-LEVEL DOWN HIERARCHICAL POWERGRID ANALYSIS" naming Kenneth Y. Yan, Anuj Trivedi and Xiaoning Qi as inventors, filed on even date and of common assignee herewith.

BACKGROUND

1. Field of the Invention

This invention relates generally to modeling circuits, and more particularly to modeling cells for hierarchical powergrid analysis.

2. Description of the Related Art

Due to the complexity of modern integrated circuits, it is often impractical to simulate the power integrity of an entire device (e.g. microprocessor) at one time. To reduce the complexity of performing such a power integrity analysis, sometimes referred to as a powergrid analysis, a hierarchical representation of the integrated circuit device may be generated. The hierarchical representation involves generating simplified models of portions of the integrated circuit device. The simplified models are then put into a higher level model of the integrated circuit device, allowing the entire device to be analyzed during a single process. Consequently, if a hierarchical powergrid analysis is to be accurate, the simplified models of the circuit portions, or cells, should also be accurate.

A full powergrid analysis of an integrated circuit device usually also includes back calculating the circuit cell's internal node voltages, resistor currents, or the like, from actual port voltages determined at a later time in the design process. Any model of a circuit cell, therefore should ideally be simple and accurate, and provide for easy back calculation.

Various modeling techniques have been used to model circuit cells for use in a hierarchical powergrid analysis. One group of such techniques, commonly referred to as Time Constant Equilibration Reduction (TICER), involve eliminating internal nodes based on time-constants. While TICER can provide adequate results in some cases, it may be less than perfect under other circumstances. For example, TICER does not necessarily produce a circuit cell model with maximum simplicity. Additionally, back calculation with TICER models can be difficult. It should be apparent, therefore, that improved techniques for modeling circuit cells for hierarchical powergrid analysis would be advantageous.

SUMMARY

Techniques for modeling a circuit cell of a microprocessor or other integrated circuit for hierarchical powergrid analysis are disclosed herein. A circuit cell of an integrated circuit generally includes a resistive-capacitive (RC) network having multiple internal nodes. Such a circuit cell also normally includes multiple transistors. The circuit cell is usually connected to other circuit cells via a global powergrid at a number of interface locations, referred to as ports.

In at least one embodiment of the present invention, the capacitance in the RC network is modeled by port capacitors connected to respective ports of the circuit cell. The transistors are modeled as independent current sources, which are in turn modeled by port current sources connected to the respective ports. The resistance component of the RC network is modeled by resistors connected between respective port pairs. The modeled resistors form a network that does not include any internal nodes, and may therefore make using the circuit cell model in a hierarchical powergrid analysis less complex.

The values of the port capacitors may be determined by employing capacitance distribution coefficients. In one embodiment, at least one capacitance distribution coefficient is determined for at least one of the circuit cell's nodes. The capacitance distribution coefficient of the node corresponds to the portion of the node's capacitance that is to be included in the port capacitor associated with a selected port. A relationship between a voltage at that node and a voltage at the selected port may also be determined as part of modeling the circuit cell for hierarchical powergrid analysis. Determining capacitance distribution coefficients for nodes, and determining a voltage relationship between nodes and ports of the circuit cell, may facilitate back-calculation of node voltages once actual port voltages are known.

In one embodiment, the capacitance distribution coefficients relating each node to a selected port may be determined by performing a static analysis of the circuit with the port voltage at the selected port set to 1 volt, while the voltages at the other ports are set to 0 volts, and the amount of current through each transistor is set to 0 amperes.

The value of each port current sources may be determined, in one embodiment, by determining an amount of current passing through a selected port when the voltage at each of the non-selected ports is set to zero. In at least one embodiment, a current distribution coefficient, similar to the capacitance distribution coefficient, is determined for each resistor in the circuit cell by performing a static analysis of the circuit cell under the same conditions used for determining the capacitance distribution coefficient.

Various embodiments of the present invention include a processing system capable of implementing the techniques disclosed herein, a computer readable medium tangibly embodying a program of executable instructions to generate a cell model, and an integrated circuit constructed according to the techniques disclosed herein.

BRIEF DESCRIPTION OF THE DRAWINGS

The present invention may be better understood, and its numerous objects, features, and advantages made apparent to those skilled in the art, by referencing the accompanying drawings.

The use of the same reference symbols in different drawings indicates similar or identical items.

DESCRIPTION OF THE PREFERRED EMBODIMENT(S)

Figure 1:
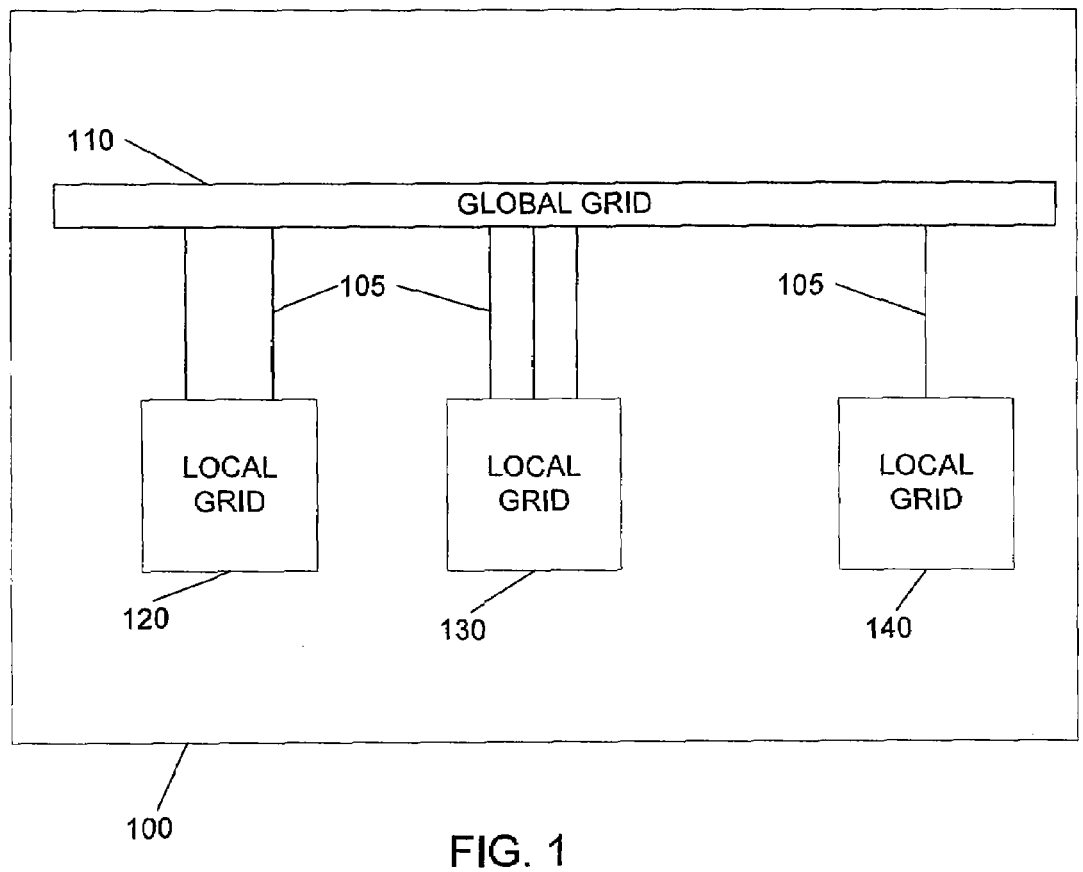
FIG. 1 is a diagram illustrating a global power grid connecting multiple circuit cells served by a local power grid according to an embodiment of the present invention.

Referring first to FIG. 1, an integrated circuit will be discussed according to an embodiment of the present invention. Integrated circuit 100 includes a global power grid 110 connected via ports 105 to multiple cells 120, 130, and 140 served by local power grids. During the design process, a hierarchical power analysis of integrated circuit 100 is performed by generating simplified models of each of the cells 120, 130, and 140 by characterizing each cell at respective ports 105. Each of the simplified models is incorporated into the global power grid to permit a complete power analysis of integrated circuit 100.

Generally, the location of ports 105 is fixed by the time each of the circuit cells 120, 130, and 140 is characterized. If, however, a global power grid analysis is performed at an early stage of the design process, the locations of the orts may not yet be fixed. In such a case, the location of the ports may be predicted and fixed at the predicted locations. Alternatively, an N-level down power grid analysis can be performed as described in related to application Ser. No. 10/876,217, entitled "N-LEVEL DOWN HIERARCHICAL POWERGRID ANALYSIS" naming Kenneth Y. Yan, Anuj Trivedi and Xiaoning Qi as inventors, filed on even date and of common assignee herewith, which is hereby incorporated by reference in its entirety. Once the locations of the ports have been determined using an N-level down approach, or some other suitable method of determining port locations, each of the cells can be characterized at those ports.

Figure 2:
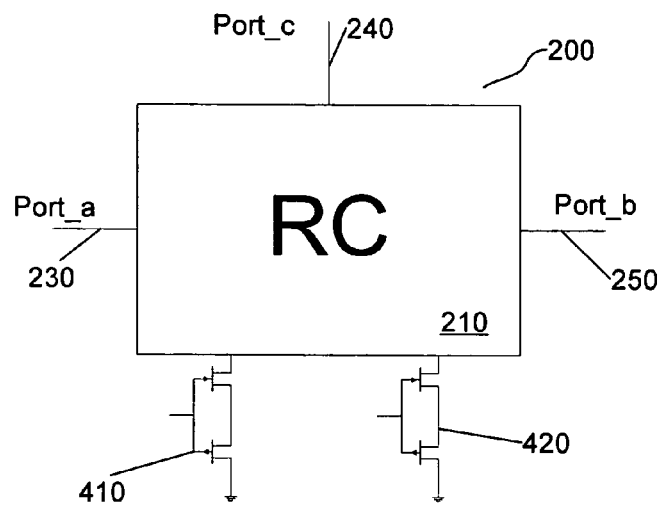
FIG. 2 is a diagram illustrating a model of a circuit cell including two circuit portions according to an embodiment of the present invention.
Figure 3:
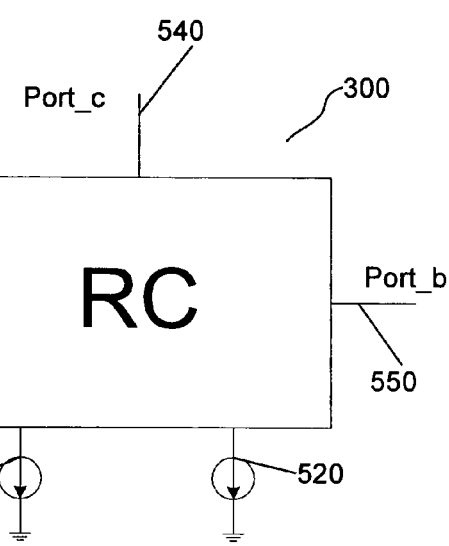
FIG. 3 is a diagram illustrating the circuit cell of FIG. 1 with the two circuit portions modeled as current sources according to an embodiment of the present invention.
Figure 4:
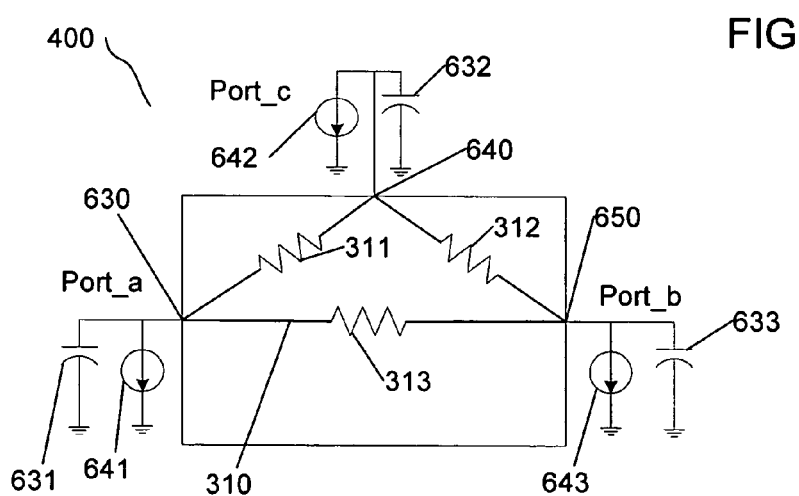
FIG. 4 is a diagram illustrating the circuit cell of FIG. 1 modeled as a resistance network connected to capacitors and current sources at each port of the cell according to an embodiment of the present invention.

Referring next to FIGS. 2-4, a technique for generating a simplified model of a circuit cell by characterizing the circuit cell at its ports will be discussed according to an embodiment of the present invention. FIG. 2 illustrates a basic model of a circuit cell 200 made up of a resistive-capacitive (RC) network 210 and transistor portions 410 and 420. Ports 230, 240, and 250 are connection locations at which circuit cell 200 will be characterized for use in analyzing a global power grid.

In at least one embodiment, a preliminary step in characterizing circuit cell 200 includes modeling circuit portions, which may include transistor portions 410 and 420, or other circuit elements, as current sources. Referring to FIG. 3, circuit model 300 illustrates transistor portions 410 and 420 (FIG. 2) replaced by current sources 510 and 520, respectively. Various modeling techniques known by those skilled in the art, including, but not limited to, the use of various automated modeling tools such as SPICE, may be used without departing from the teachings set forth herein.

Circuit model 300 is further refined as illustrated by cell model 400 in FIG. 4. The RC network 210 is replaced by resistive network 310, having no internal nodes. The capacitive elements of former RC network 210 have been modeled as capacitors 631, 632, and 633 connected to ports 630, 640, or 650, respectively. Current sources 510 and 520 (FIG. 3) have been distributed between ports 630, 640, and 650 respectively, and are modeled as current sources 641, 642, and 643. Techniques and processes by which circuit cell 200 is modeled as cell model 400 are described in greater detail below.

Figure 5:
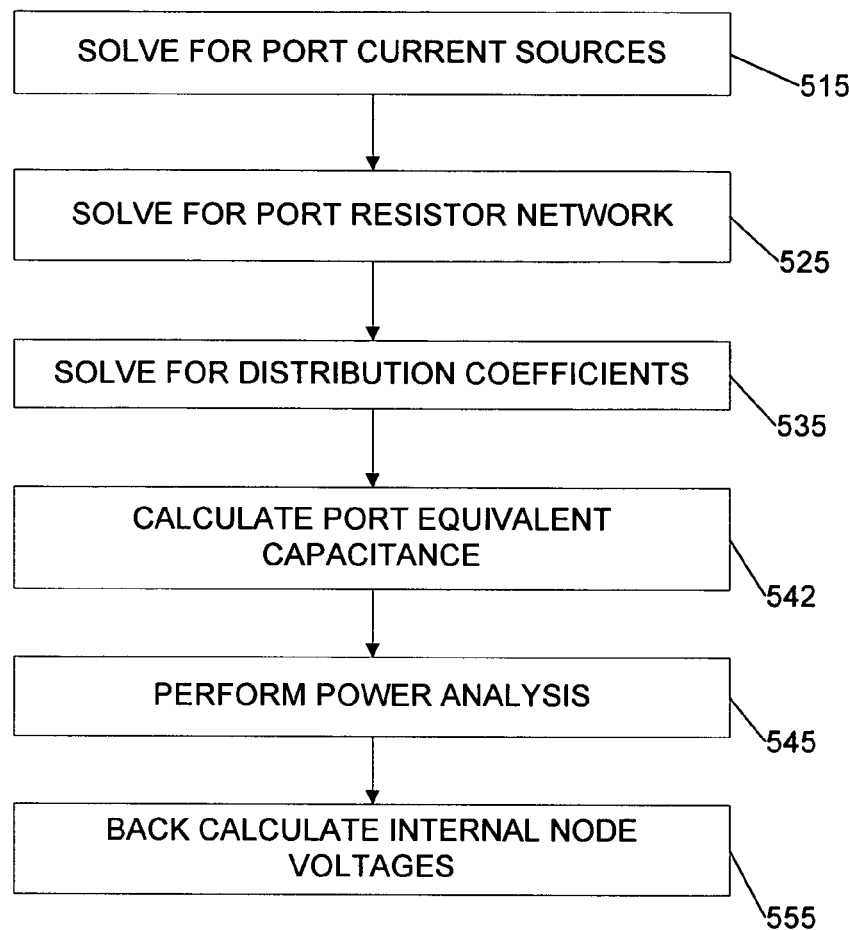
FIG. 5 is a flow diagram illustrating a method according to an embodiment of the present invention.

Referring next to FIGS. 4 and 5, a method of generating cell model 400 will be discussed according to an embodiment of the present invention. The illustrated flow diagram 500 presupposes that appropriate ports of a circuit cell to be characterized have already been selected, and that a basic model of the circuit cell, similar to that illustrated in FIG. 3, has previously been constructed. Note that although the following discussion may make reference to particular simulation and/or circuit analysis tools, the techniques and principles discussed herein are not limited to only the particular tools mentioned. Rather, any of various suitable simulation or analysis tools known to those skilled in the art may be employed consistent with the teachings set forth herein.

The illustrated method begins at 515 by solving for port current sources, e.g. 641, 642 and 643. To determine the port current sources, a description of the circuit cell, including RC network 210 and current sources 510, 520 (FIG. 3) may be entered into any of various circuit analysis tools, for example SPICE, using an object-oriented visual interface, a netlist, or the like.

Having defined the circuit cell in the simulation tool, a simulation is performed. In at least one embodiment, in order to solve for port current sources 641, 642, and 643, a single dynamic analysis of the circuit cell with port voltage sources set to 0V is performed. This dynamic analysis provides the worst-case current at each of the ports, and current sources 641, 642, and 643, are assigned a value corresponding to the worst case current at respective ports. In at least one embodiment, the dynamic analysis is also used to compute peak current, root-mean-square (rms) current, and average current at resistors, as well as the voltage at each internal node of RC network 210.

The illustrated method proceeds to 525, at which time the method solves for port resistor network 310. The port resistor network 310, according to at least one embodiment of the present invention, is made up of one resister connected between each set of nodes. For example, the port resister network 310 illustrated in FIG. 4 includes three resistors 311, 312, and 313. In the embodiments illustrated in FIG. 4, there are three node pairs, (650, 630), (650, 640), and (630, 640). The resistor 311 is connected between nodes 630 and 640. The resistor 312 is connected between nodes 640 and 650. The resistor 313 is connected between nodes 630 and 650. The resulting resistor network 310 has one resistor connected between each set of ports.

In other embodiments, if a circuit cell includes four ports for example, the resistor network determined at 520 would include resistors 311, 312 and 313, in addition to any extra resistors required to connect the fourth port (not illustrated) to each of the other three ports. Similarly, extra resistors may be included in a resistor network for circuit cells including more than four ports, or fewer resistors may be included in a resistor network for a circuit cell having fewer than three ports. In any case, at least one embodiment of the present invention provides for a resistor network having no internal nodes, e.g. each resistor of the resistor network is connected only at the ports. Removing internal nodes from resistor network 310 allows for a greatly simplified circuit cell model that may help reduce computational complexity during global power grid analysis.

Static analysis runs may be used to solve for port resistor networks. In one embodiment of the present invention, a number of static analysis runs corresponding to the number of ports are performed. Thus, three static analysis runs are performed for the circuit cell illustrated in FIG. 4, four static analysis runs are performed for a circuit cell having four ports, and so on. While the discussion focuses on the three port circuit cell illustrated in FIG. 4, similar techniques can be applied to circuit cells having more than three ports, or fewer than three ports.

Referring briefly to FIGS. 2 and 4, a static analysis run according to an embodiment of the present invention will be discussed. It will be appreciated that various RC networks included in actual circuit cells to be analyzed may be vastly more complex than the illustrated RC network. The same principles discussed with reference to RC network 210, however, may employed without departing from the scope of the teachings set forth herein.

Since the RC network illustrated in FIG. 4 has three ports 630, 640, and 650, three static analysis runs are performed. For the first static analysis run, the voltage at port 630 is set to 1V, while ports 240 and 250 are grounded (set to 0V). The currents drawn by transistor portions, which may include transistor portions 410 and 420 or other circuit elements, are set to 0A. Note that setting the currents of circuit elements to 0V effectively disconnects those elements from the cell.

During the first static analysis run, the currents flowing through ports 640 and 650 are measured, and used to compute the value of resistors 311 and 313 using Ohm's law. For example, the difference between the voltage at port 630 and the voltage at port 650 is 1V, based on the constraints applied during the static analysis. Since only port 630 has any voltage applied (1V), any current flowing through port 650 must be due to the voltage and port 630. Thus, the value of resistor 313 can be computed by dividing 1V (the voltage drop between port 230 and 250) by the current flowing through port 250. The same principle can be applied in calculating the value of resistors 312 and 311 during subsequent static analysis runs, wherein the selected port has its voltage set to 1V and the remaining ports are set to 0V.

Figure 6:
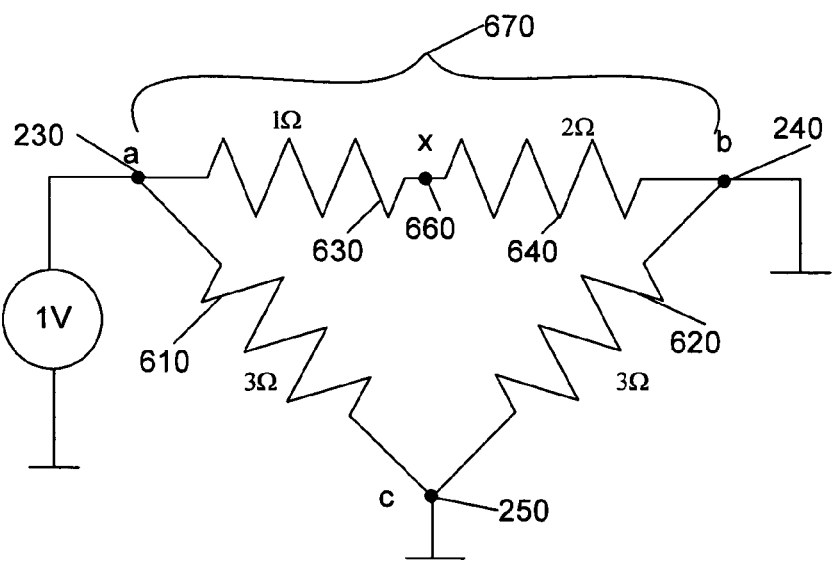
FIG. 6 is a schematic diagram of a resistive-capacitive (RC) network according to an embodiment of the present invention.

The method illustrated in FIG. 5 also uses the static analysis runs to solve for distribution coefficients at 535. Referring to FIG. 6, determining distribution coefficients using the static analysis runs will be discussed. According to at least one embodiment of the present invention, distribution coefficients are determined on a per node basis, with each distribution coefficient reflecting the portion of a node's voltage, capacitance, etc., which is to be distributed to a respective port.

Recall that the static analysis runs are performed with a single port having a voltage level of 1V while voltages at the remaining ports are set to 0V. For the illustrated three-port example of FIG. 6, the voltage at any internal node of RC network 210 can be described in general by the following equation:

$$V\text{node} = (\alpha\text{node}*V230) + (\beta\text{node}*V240) + (\gamma\text{node}*V250) + (i*I1) + (j*I2);$$

where αnode, βnode and γnode, are distribution coefficients, and the terms (i*I1) and (j*I2) are voltage components of the two transistor portions 410 and 420. Given a static analysis run with the voltage at node 230 (V230)=1V, the voltage at node 240 (V240)=0V, and the voltage at node 250 (V250)=0V, and recalling that the currents (I1 and I2) through both circuit portions are set to 0A, the equation reduces to Vnode=αnode. Thus, by measuring the voltage at any particular node of the RC network 210 during a static analysis run, a distribution coefficient relating the node under consideration to port 230 can be determined. The distribution coefficients αnode and γnode, relating the node under consideration to ports 240 and 250, respectively, can be determined in a similar manner.

Consider the following example based on the simple RC network 210 illustrated in FIG. 6. With only one internal node 660, three distribution coefficients are calculated: α660, β660, and γ660. The coefficient α660 describes a relationship between node 660 and port 230. The coefficients β660, and γ660 describe relationships between node 660 and ports 240 and 250, respectively. As will be apparent to those skilled in the art, the voltage at node 660 can be determined by calculating the current through branch 670, (1V/3Ω=⅓A), and multiplying that current times the value of resistor 640, (2Ω), which results in a value of ⅔V (⅓A*2Ω). Because of the constraints under which the static analysis is run, V660=α660=⅔ (a unit-less coefficient). The remaining coefficients can be determined during subsequent static analysis runs in the same manner to determine that β660=⅓, and γ660=0.

It should be noted that because of the simplicity of the example RC circuit 210, each of the distribution coefficients can be determined using a single static analysis run. In other circumstances, however, coefficients relating a particular node to each of the ports 230, 240, and 250 are determined during different static analysis runs. It should also be noted that although the port voltages are set to 1V or 0V, depending on the port under consideration, different voltages may be used consistent with the teachings set forth herein. Different voltages, however, may require more complicated mathematical analysis under some circumstances.

Referring again to FIGS. 4 and 5, once the distribution coefficients have been determined at 535, port equivalent capacitances can be determined at 542. To calculate port equivalent capacitors 631, 632, and 633, the capacitance at each internal node (not illustrated) is distributed among the three ports 630, 640, and 650, using the previously determined distribution coefficients α, β, and γ. The final port capacitance value (to a first-order approximation) is the sum of the contributions from all of the internal nodes of the RC network. Thus, the value of port capacitor 631 is described by the following equation: C631=(αnode1*Cnode1)+(αnode2*Cnode2)+(αnode3*Cnode3) . . . (αnodeN*CnodeN). Likewise, the value of port capacitor 633=(βnode1*Cnode1)+(βnode2*Cnode2)+(βnode3*Cnode3)... (βnodeN*CnodeN). The port capacitors for any additional ports can likewise be calculated.

Referring again to FIG. 6, note that although the solution for the RC network illustrated in FIG. 6 may be trivial, if node 660 had a capacitance value C to be distributed, the port capacitor 631 would have a value of ⅔C, the port capacitor 633 would have a value of ⅓C, and the value of port capacitor 632 would be 0C.

In at least one embodiment, current distribution coefficients are also computed for each resistor in RC network 210. For the three node cell illustrated in FIG. 6, the equations becomes Iresistor=(αresistor*V230)+(βresistor*V240)+(γresistor*V250)+(s*I1)+(t*I2); where αresistor, βresistor and γresistor, are current distribution coefficients relating the distribution of current flowing through a particular resistor among the various nodes, and the terms (s*I1) and (t*I2) are current components of the two transistor portions 410 and 420. Similarly to the voltage and capacitance distribution coefficients, the above equation reduces to Iresistor=αresistor when a static analysis run is performed with the voltage at node 230 set to 1V.

For example, a coefficient for each resistor may be determined during each of three static analysis runs. During the first static analysis run, the current through each resistor is simulated, and α630, α640, α610, and α620 are determined. In the present example, using the RC network 210 illustrated in FIG. 6, α630=⅓, α640=⅓, α610=⅓, and α620=0. Similar calculations can be made to determine βresistor and γresistor relating the portion of current flowing through each resistor that is to be allocated to respective ports. While at least one embodiment does not use these current distribution coefficients to construct a model of the local circuit cell, these current distribution coefficients can be used in back calculation.

At this point, a model 400 of circuit cell 200 has been generated, and is ready for use in performing a global powergrid analysis. Each circuit cell that is served by the global powergrid may be modeled in the same way as circuit cell 200, and block 545 of the method can provide the characteristics of the models, such as PowerView, or some other power analysis description, for incorporation into the global powergrid analysis package. Use of such software packages to perform global power analysis with cell models constructed according the teachings disclosed herein will become apparent to those skilled in the art upon consideration of the present disclosure.

At some point in the design process, after the global power analysis is performed by the method at 545, voltages at the ports of the modeled cell become more accurately known. After these more definite port voltages become known, it may be advantageous to back-calculate the voltages at the internal nodes of an RC network using these more accurate port voltages. In at least one embodiment, the distribution coefficients calculated during the modeling process are saved for later use in performing these back calculations. It will become apparent upon consideration of the distribution coefficients discussed herein that in addition to being useful for node capacitance values, etc. of a local RC network to cell ports, the distribution coefficients can be used to distribute voltages, and the like back to particular nodes in an inverse fashion. Thus, for example, if a cell port has 5 distribution coefficients corresponding to 5 internal nodes, and each distribution coefficient indicates that ⅕ of any voltage (or capacitance, etc.) comes from each of the internal nodes, a port voltage of 5V will result in each node having a back-calculated voltage of 1V.

In at least one embodiment, for each circuit cell, block, or other circuit portion modeled as part of a local powergrid, peak, rms, and average port currents are stored. For each node within the circuit cell, a distribution coefficient corresponding to each port of the cell is stored. Thus, for a 4 port cell, 4 distribution coefficients will be stored for each internal node. Although not specifically needed to generate the reduced model used for hierarchical powergrid analysis, current distribution coefficients associating a portion of current flowing through each resistor to respective ports can also be stored to aid in back calculations. In addition, peak, rms, and average current through each resistor, as determined during a dynamic analysis or otherwise, may also be stored.

Figure 7:
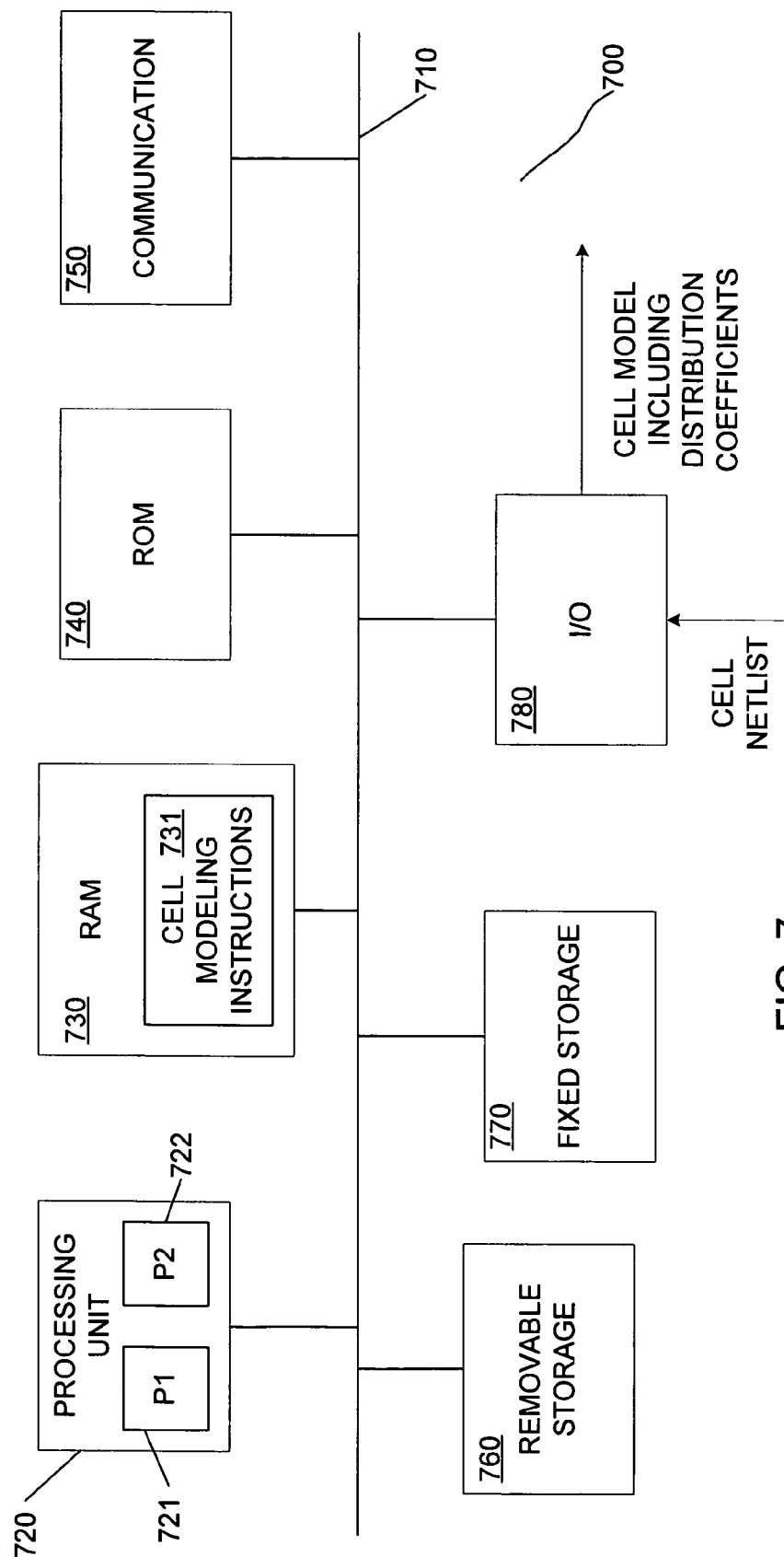
FIG. 7 is a block diagram illustrating a system according to an embodiment of the present invention.

Referring next to FIG. 7, a processor suitable for use in implementing a program of executable instructions on a computer readable medium according to various embodiments of the present invention is discussed. As will be appreciated, the term "computer readable medium" encompasses memory devices such as various forms of computer memory, including for example, random access memory (RAM) and read only memory (ROM), electromagnetic disk drives, optical drives, various forms of propagated signals, magnetic tapes, optical tapes, paper tapes, and any similar medium used in transporting or storing computer readable information.

The data processor 700 illustrated in FIG. 7 includes a number of devices connected to a common system bus 710. Processing unit 720 includes one or more devices and/or processing cores 721 and 722, sometimes referred to as central processing units (CPUs) that obtain information to be processed, such as a cell netlist, over system bus 710, process the information, and output results, such as a cell model, to one of the connected devices. RAM 730 and/or ROM 740 store programs and/or data, for example cell modeling instructions 731, for execution by processing unit 720. Removable storage 760 may include storage devices having removable media, such as floppy disks, compact disks, tape drives, memory sticks, and the like. Fixed storage 770 includes such devices as hard disk drives and the like that do not have removable media. Generally, both removable storage 760 and fixed storage 770 are used for bulk storage of information and/or programs. The information and programs stored in fixed storage 770 and removable storage 760 are usually copied to RAM 730 for faster access by processing unit 720. Finally, communications device 750 includes network interface cards, modulator/demodulators (modems), and the like, while input output unit (I/O) 780 includes devices such as keyboards, speakers, monitors, and pointing devices.

Although various embodiments of the present invention have been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method of generating circuit cell models for powergrid analysis, the method comprising:
   obtaining a first model of a circuit cell to be modeled for semiconductor powergrid analysis, the first model including:
   a plurality of ports;
   one or more transistors; and
   a resistive-capacitive (RC) network having a plurality of internal nodes, the RC network being coupled to the plurality of ports and the one or more transistors;
   determining respective first capacitance distribution coefficients for respective internal nodes of the plurality of internal nodes, each first capacitance distribution coefficient associating a portion of a capacitance value at a corresponding internal node with a first port of the plurality of ports;
   back-calculating the voltage at the respective internal nodes based, at least in part, on the respective capacitance distribution coefficients;
   modeling a resistance of the RC network as a resistive network;
   modeling the capacitance of the RC network as a plurality of capacitors, each capacitor coupled to a corresponding port of the plurality of ports, wherein the value of the modeled capacitor coupled to the first port is determined by the sum of the capacitance value portions associated with the first port; and
   providing a powergrid analysis for the circuit cell.

2. The method of claim 1 further including:
  determining respective second capacitance distribution coefficients for the respective internal nodes, each second capacitance distribution coefficient associating a portion of the capacitance value at a corresponding internal node with a second port; and
  wherein the value of the modeled capacitor coupled to the second port is the sum of the respective capacitance values associated with the second port.

3. The method of claim 1 wherein modeling the resistive network includes modeling the resistive network as a plurality of resistors coupled between respective pairs of ports.

4. The method of claim 3 wherein the resistive network includes nodes only at the plurality of ports.

5. The method of claim 1 wherein determining the first capacitance distribution coefficients includes:
  simulating application of a non-zero voltage at the first port;
  simulating application of zero volts at each remaining port;
  simulating zero amperes of transistor current for the one or more transistors; and
  determining simulated voltages at the respective internal nodes given the simulated port voltages and transistor currents, wherein the first capacitance distribution coefficients are determined based on the simulated voltage at corresponding internal nodes.

6. The method of claim 1 wherein the first model of the circuit cell includes a plurality of resistors, and the method further comprises:
  determining first current distribution coefficients for respective resistors of the plurality of resistors, wherein the current distribution coefficients identify portions of currents flowing through respective resistors that also flow through the first port.

7. The method of claim 6 wherein determining the first current distribution coefficients includes:
  simulating application of a non-zero voltage at the first port;
  simulating application of zero volts at each remaining port;
  simulating zero amperes of transistor current for the one or more transistors;
  determining simulated currents flowing through the respective resistors; and
  determining respective first current distribution coefficients based on the simulated current flowing through corresponding resistors.

8. The method of claim 7 further including back-calculating an amount of current passing through respective resistors based, at least in part, on corresponding first current distribution coefficients.

9. The method of claim 1 further including determining a value of a current source model associated with the first port.

10. The method of claim 9 wherein the current source model includes an independent current source.

11. The method of claim 9 wherein determining a port current source includes:
  simulating a zero voltage at each of the plurality of ports; and
  performing a dynamic analysis of the first model of the circuit cell to determine an amount of current flowing through the first port, wherein the current source model associated with the first port has a value corresponding to a maximum amount of current passing through the first port during the dynamic analysis.

12. The method of claim 9 wherein the current source model includes a portion of a current drawn by the one or more transistors included in the first model.

13. A method of generating local cell models for power-grid analysis, the method comprising:
  determining, for a model of a local cell including a plurality of ports and a plurality of internal nodes, a relationship between a voltage at each of the plurality of ports and a voltage at each of the plurality of internal nodes;
  performing a back calculation based, at least in part, on the determined relationship between the voltage at each of the plurality of ports and the voltage at each of the plurality of internal nodes;
  generating a reduced model for use in a hierarchical power analysis, the reduced model generated, at least in part, based on the determined relationship between the voltage at each of the ports and respective internal nodes; and
  providing a powergrid analysis for the local cell.

14. The method of claim 13 wherein generating a reduced model includes modeling capacitance values at the internal nodes as respective capacitances associated with each of the plurality of ports.

15. The method of claim 14 wherein the modeling capacitance values includes determining, for each internal node, capacitance distribution coefficients associating a portion of the capacitance value of respective internal nodes with each of the plurality of ports.

16. The method of claim 13 wherein generating a reduced model includes determining a resistance value between each port of the plurality of ports and respective other ports of the plurality of ports.

17. The method of claim 13 wherein generating a reduced model includes modeling transistors included in the model of the local cell as respective independent current sources, each independent current source being associated with a respective port of the plurality of ports.

18. The method of claim 13 wherein the model of the local cell further includes a plurality of resistors, and wherein the method further includes determining, for each of the plurality of resistors, a current distribution coefficient associated with each of the plurality of ports.

19. A method for use in modeling a cell for hierarchical powergrid analysis, the method comprising:
  determining a port capacitance value for a selected port of a cell including a plurality of ports, wherein the port capacitance value for the selected port includes a portion of a capacitance value at each of a plurality of internal nodes;
  back-calculating a voltage at the respective internal nodes based, at least in part, on the capacitance values at each of the plurality of internal nodes;
  determining a port current source value for the selected port, wherein the port current source value for the selected port corresponds to an amount of current passing through the selected port if a voltage at each of the plurality of ports is set to zero;
  determining a resistance value between the selected port and each other port of the plurality of ports; and
  providing a powergrid analysis for the cell.

20. The method of claim 19 wherein determining the port capacitance value includes:
  simulating application of one volt at the selected port;
  simulating application of zero volts at each remaining port;

simulating zero amperes of transistor current for each of a plurality of transistors included in the circuit cell; and determining simulated voltages at respective internal nodes given the simulated port voltages and transistor currents, wherein the portion of the node capacitances to be included in the port capacitance value is determined based on the simulated voltages at corresponding internal nodes.

21. The method of claim 19 wherein the local cell model further includes a plurality of resistors; and the method further comprises determining a current distribution coefficient for each of the plurality of resistors, wherein a current distribution coefficient corresponds to a portion of a current flowing through a resistor of the plurality of resistors that also flows through the selected port.

22. The method of claim 21 wherein determining each current distribution coefficient includes:

simulating application of one volt at the selected port;

simulating application of zero volts at each remaining port;

simulating zero amperes of transistor current for the one or more transistors;

determining simulated currents flowing through each of the plurality of resistors; and determining respective current distribution coefficients for respective resistors based on the current flowing through the respective resistors.

23. The method of claim 22 further including back-calculating an amount of current passing through each of the plurality of resistors based, at least in part, on the respective current distribution coefficients.

24. A storage computer medium for generating a circuit cell model for powergrid analysis, including sets of instructions, which when executed by a machine, cause the machine to:

determine at least one capacitance distribution coefficient for at least one of a plurality of internal nodes of a circuit cell model to be reduced for powergrid analysis, wherein the at least one capacitance distribution coefficient indicates a portion of a capacitance at the at least one internal node to be included in a model of a port capacitance at a selected port of a plurality of ports of a reduced model of the circuit cell model;

back-calculate a voltage at the at least one internal node based, at least in part, on the at least on capacitance distribution coefficient; and provide a powergrid analysis for the circuit cell.

25. The storage computer medium of claim 24 wherein the sets of instructions further cause the machine to:

simulate application of a non-zero voltage at the selected port;

simulate application of zero volts at each remaining port of the plurality of ports;

simulate zero amperes of transistor current for a transistor included in the circuit cell being modeled; and determine a simulated voltage at the at least one internal node given the simulated port voltages and transistor current; and determine the at least one capacitance distribution coefficient based on the simulated voltage at the at least one internal node.

26. The storage computer medium of claim 24 wherein the circuit cell model to be reduced includes a plurality of resistors; and the sets of instructions further cause the machine to determine at least one current distribution coefficient for at least one of the plurality of resistors, wherein the at least one current distribution coefficient corresponds to a portion of a current flowing through the at least one resistor that also flows through the selected port.

27. The storage computer medium of claim 26 wherein the sets of instructions further cause the machine to:

simulate application of a non-zero voltage at the selected port;

simulate application of zero volts at each remaining port of the plurality of ports;

simulate zero amperes of transistor current for a transistor included in the circuit cell being modeled;

determine a simulated current flowing through the at least one resistor; and determine the at least one current distribution coefficient based on the simulated current flowing through the at least one resistor.

28. The storage computer medium of claim 27 wherein the sets of instructions further cause the machine to back-calculate an amount of current passing through the at least one resistor based, at least in part, on the at least one current distribution coefficient.

29. The storage computer medium of claim 24 wherein the sets of instructions further cause the machine to determine a value of a current source model associated with the selected port.

30. The storage computer medium of claim 24 wherein the sets of instructions further cause the machine to determine a resistance value between the selected port and each of the other ports.

31. A computer readable storage medium for generating a circuit cell model for powergrid analysis tangibly embodying a program of executable instructions to be executed by a processor, the program of instructions including at least one executable instruction to:

determine, for a node of a circuit cell being modeled for hierarchical powergrid analysis, a distribution coefficient, wherein the node has a capacitance value, and wherein the distribution coefficient corresponds to a portion of the capacitance value to be distributed to a selected port of the circuit cell;

back-calculate a voltage at the node of the circuit cell based, at least in part, on the capacitance distribution coefficient; and provide a powergrid analysis for the circuit cell.

32. The computer readable storage medium of claim 31 wherein the at least one executable instruction to determine the capacitance distribution coefficient includes:

at least one executable instruction to simulate one volt at the selected port;

at least one executable instruction to simulate zero volts at each of a plurality of other ports of the circuit cell;

at least one executable instruction to simulate zero transistor current for each of a plurality of transistors included in the circuit cell;

at least one executable instruction to determine a voltage at the node of the circuit cell; and at least one executable instruction to set the capacitance distribution coefficient equal to the voltage at the node of the circuit cell.

33. The computer readable storage medium of claim 31 wherein the circuit cell includes a plurality of resistors; and further comprising at least one executable instruction to determine at least one current distribution coefficient for at least one of the plurality of resistors, wherein the at least one current distribution coefficient corresponds to a portion of a current flowing through the at least one resistor that also flows through the selected port of the circuit cell.

34. The computer readable storage medium of claim 33 further including at least one executable instruction to back-calculate an amount of current passing through the at least one resistor based, at least in part, on the at least one current distribution coefficient.

35. The computer readable storage medium of claim 31 further including at least one executable instruction to determine a port current source associated with the selected port.

36. The computer readable storage medium of claim 35 wherein the at least one executable instruction to determine a port current source includes:
at least one executable instruction to simulate zero volts at each of a plurality of ports of the circuit cell; and
at least one instruction to perform a dynamic analysis of the circuit cell to determine an amount of current passing through the selected port, wherein the port current source has a value corresponding to the amount of current passing through the selected port.

37. The computer readable storage medium of claim 31 further including at least one executable instruction to determine a resistance value between the selected port and each of the other ports.

38. A method of generating a circuit cell model for powergrid analysis, the method comprising:
determining at least one capacitance distribution coefficient for at least one of a plurality of internal nodes of a circuit cell being modeled for powergrid analysis, wherein the at least one internal node has a capacitance value, and wherein the at least one capacitance distribution coefficient corresponds to a portion of the capacitance value to be included in a port capacitor associated with a selected one of a plurality of ports of the circuit cell;
back-calculating a voltage at the at least one internal node based, at least in part, on the at least one capacitance distribution coefficient; and
providing a powergrid analysis for the circuit cell.

39. The method of claim 38 wherein determining the at least one capacitance distribution coefficient includes:
simulating one volt at the selected port;
simulating zero volts at each of the other ports of the circuit cell;
simulating zero transistor current for each of a plurality of transistors included in the circuit cell;
determining a voltage at the at least one internal node; and
setting the at least one capacitance distribution coefficient equal to the voltage at the at least one internal node.

40. The method of claim 38 wherein the circuit cell includes a plurality of resistors; and
wherein the method further includes determining at least one current distribution coefficient for at least one of the plurality of resistors, wherein the at least one current distribution coefficient corresponds to a portion of a current flowing through the at least one resistor that also flows through the selected port of the circuit cell.

41. The method of claim 40 wherein determining the at least one current distribution coefficient includes:
simulating one volt at the selected port;
simulating zero volts at each of the other ports;
simulating zero transistor current for each of a plurality of transistors included in the circuit cell;
determining a current flowing through the at least one resistor; and determining the at least one current distribution coefficient based on the determination.

42. The method of claim 41 wherein the method further includes back-calculating an amount of current passing through the at least one resistor based, at least in part, on the at least one current distribution coefficient.

43. The method of claim 38 wherein the method further includes determining a port current source associated with the selected port based on a dynamic analysis of the circuit cell to determine an amount of current flow through the selected port, wherein the port current source has a value corresponding to the amount of current passing through the selected port.

44. The method of claim 38 wherein the method further includes determining a resistance value between the selected port and each of the other ports.

* * * * *